(12) United States Patent
Huang et al.

(10) Patent No.: US 8,946,847 B2
(45) Date of Patent: Feb. 3, 2015

(54) BACKSIDE ILLUMINATED IMAGE SENSORS AND METHOD OF MAKING THE SAME

(71) Applicant: Taiwan Semiconductor Manufacturing Company, Ltd., Hsinchu (TW)

(72) Inventors: Kuan-Chieh Huang, Hsinchu (TW);
Chih-Jen Wu, Hsinchu (TW);
Chen-Ming Huang, Hsinchu (TW);
Dun-Nian Yaung, Taipei (TW);
An-Chun Tu, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/172,053

(22) Filed: Feb. 4, 2014

(65) Prior Publication Data

US 2014/0151835 A1    Jun. 5, 2014

Related U.S. Application Data

(63) Continuation of application No. 12/766,130, filed on Apr. 23, 2010, now Pat. No. 8,674,469.

(60) Provisional application No. 61/171,998, filed on Apr. 23, 2009.

(51) Int. Cl.
*H01L 27/146* (2006.01)

(52) U.S. Cl.
CPC ........ *H01L 27/1463* (2013.01); *H01L 27/1464* (2013.01); *H01L 27/14689* (2013.01); *H01L 27/14625* (2013.01); *H01L 27/14687* (2013.01); *H01L 27/14627* (2013.01)
USPC .................... 257/446; 257/447; 257/E31.121

(58) Field of Classification Search
CPC ..................... H01L 27/1463; H01L 27/14687; H01L 27/14625; H01L 27/1464; H01L 27/14689
USPC .................. 257/432, 446, 447, 460, E31.121
See application file for complete search history.

(56) References Cited

U.S. PATENT DOCUMENTS

| | | | |
|---|---|---|---|
| 4,377,817 | A | 3/1983 | Nishizawa et al. |
| 5,960,276 | A | 9/1999 | Liaw et al. |
| 6,852,562 | B1 | 2/2005 | Hopper et al. |
| 7,154,136 | B2 | 12/2006 | Cole et al. |
| 7,354,812 | B2 | 4/2008 | Batra et al. |
| 7,400,004 | B2 | 7/2008 | Cole et al. |
| 7,492,027 | B2 | 2/2009 | Mouli |
| 7,518,172 | B2 | 4/2009 | Moon et al. |
| 7,741,141 | B2 | 6/2010 | Wilson et al. |
| 7,768,085 | B2 | 8/2010 | Wilson et al. |

(Continued)

*Primary Examiner* — Allan R Wilson
(74) *Attorney, Agent, or Firm* — Lowe Hauptman & Ham, LLP

(57) ABSTRACT

A backside illuminated image sensor includes a substrate with a substrate depth, where the substrate includes a pixel region and a peripheral region. The substrate further includes a front surface and a back surface. The backside illuminated image sensor includes a first isolation structure formed in the pixel region of the substrate, where a bottom of the first isolation structure is exposed at the back surface of the substrate. The backside illuminated image sensor includes a second isolation structure formed in the peripheral region of the substrate, where the second isolation structure has a depth less than a depth of the first isolation structure. The backside illuminated image sensor includes an implant region adjacent to at least a portion of sidewalls of each isolation structure in the pixel region.

20 Claims, 6 Drawing Sheets

(56) References Cited

U.S. PATENT DOCUMENTS

| | | | |
|---|---|---|---|
| 7,768,090 B2 * | 8/2010 | Yasukawa | 257/446 |
| 7,838,956 B2 * | 11/2010 | McCarten et al. | 257/447 |
| 8,237,206 B2 | 8/2012 | Wu | |
| 2007/0194356 A1 | 8/2007 | Moon et al. | |
| 2009/0200625 A1 | 8/2009 | Venezia et al. | |
| 2009/0250778 A1 | 10/2009 | Shimotsusa | |
| 2010/0252870 A1 | 10/2010 | Lin et al. | |
| 2011/0163363 A1 | 7/2011 | Kim et al. | |

* cited by examiner

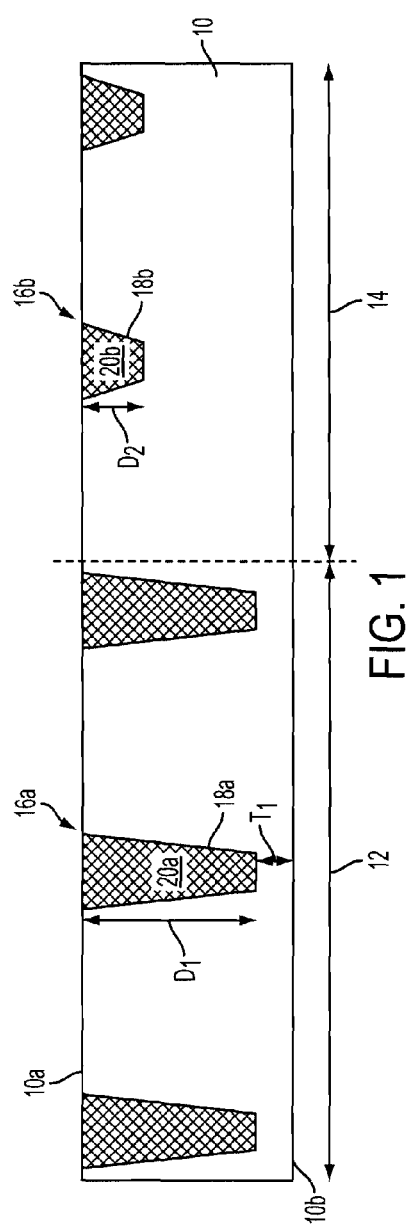
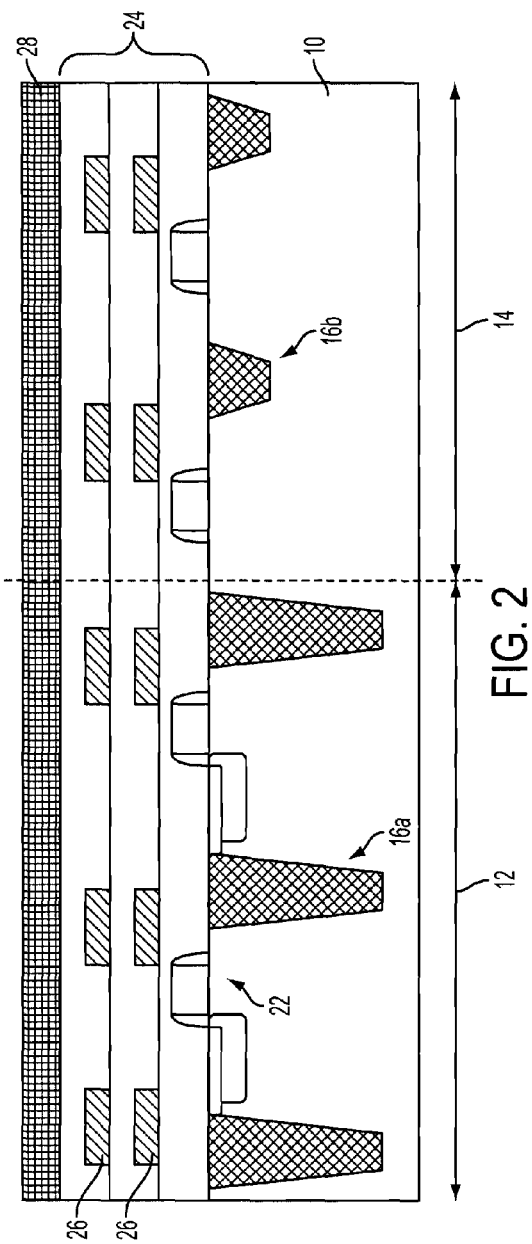

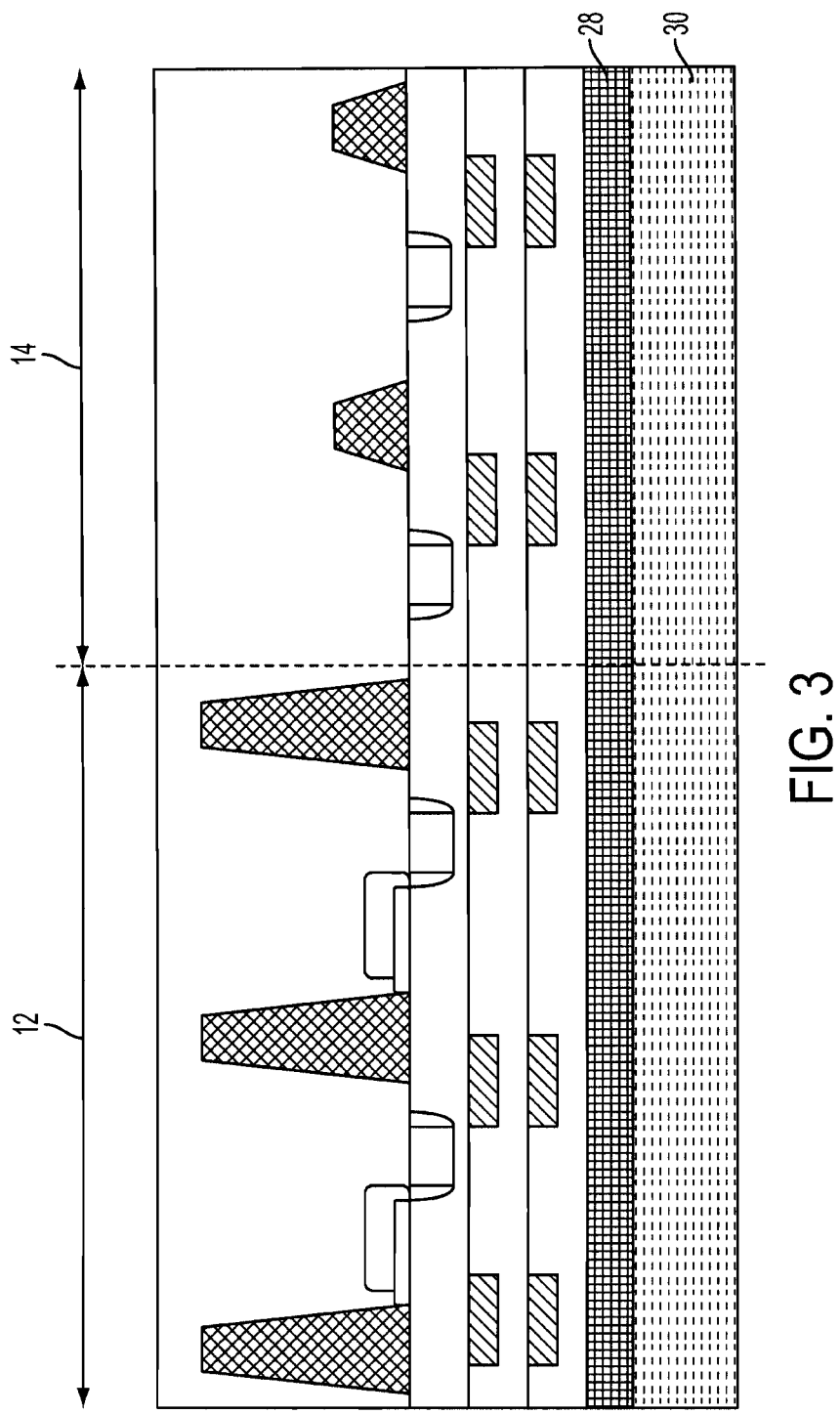

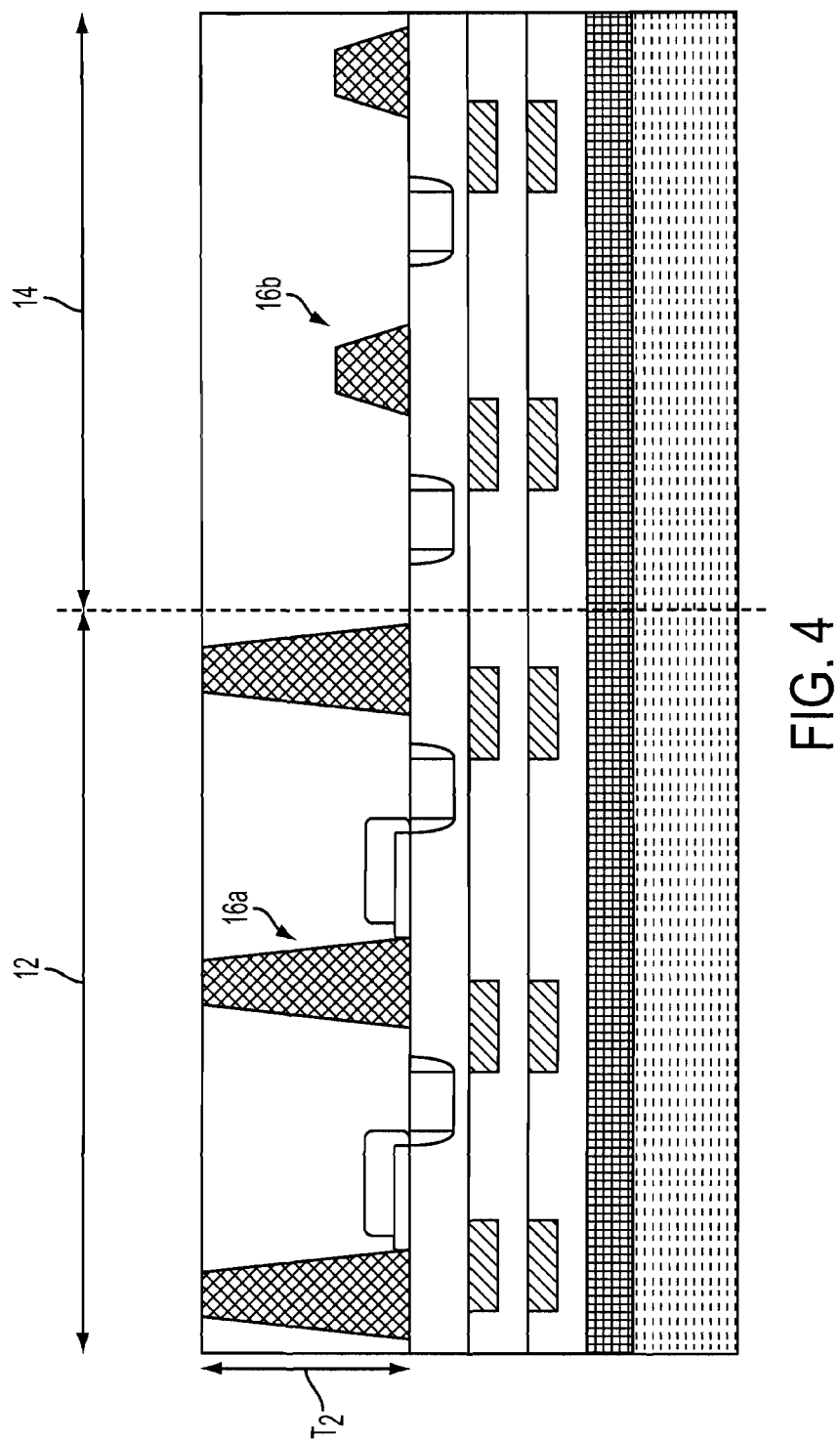

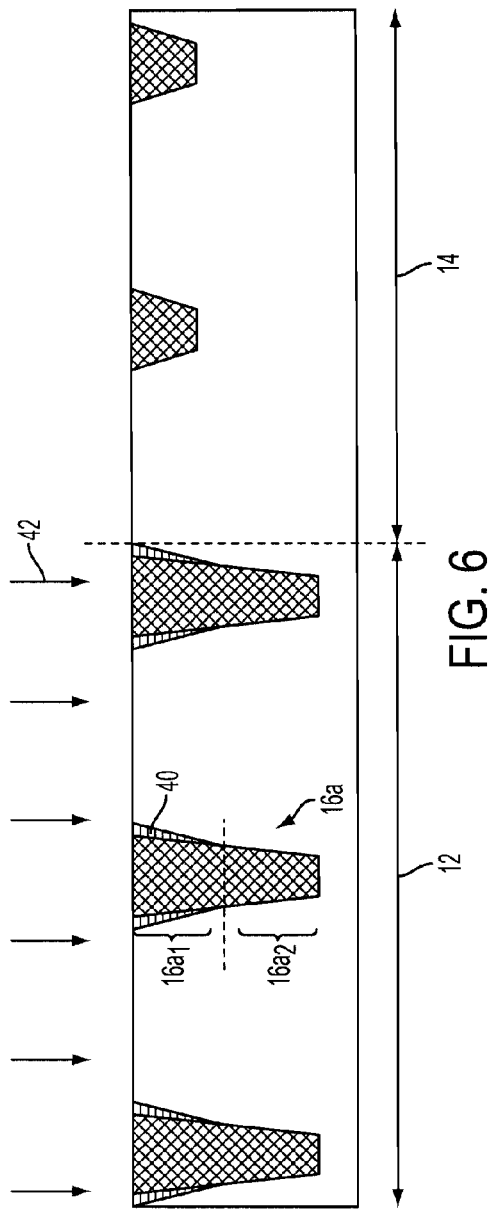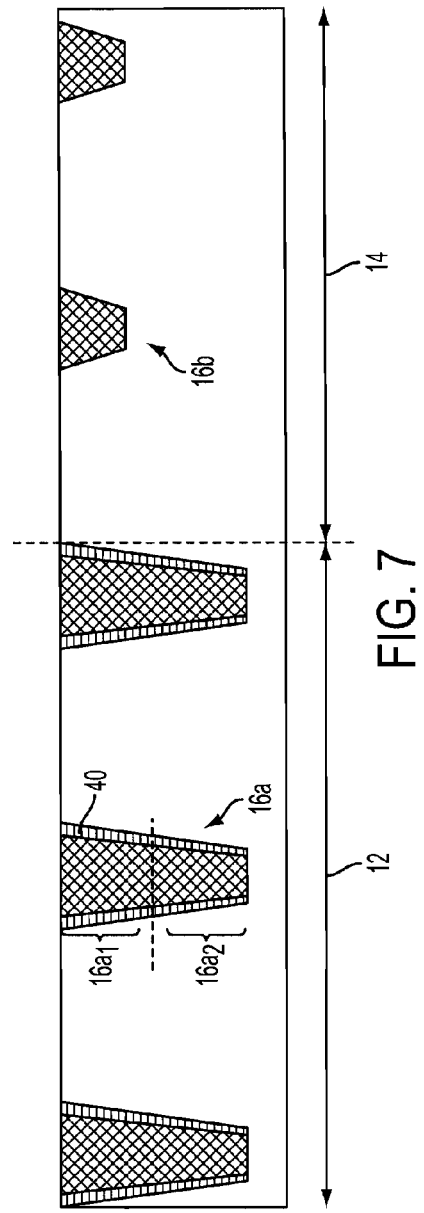

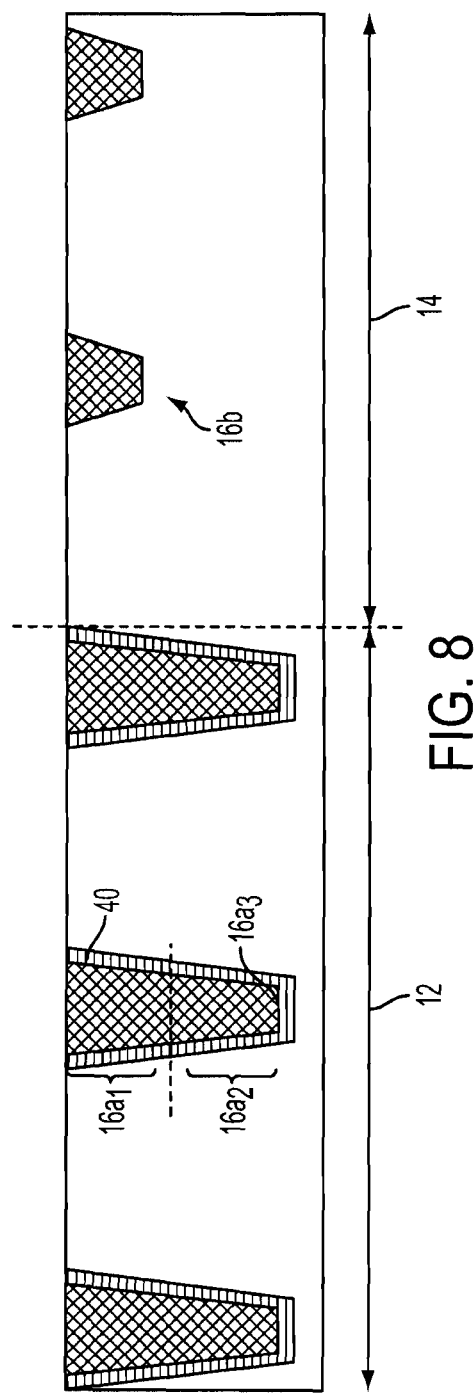

US 8,946,847 B2

BACKSIDE ILLUMINATED IMAGE SENSORS AND METHOD OF MAKING THE SAME

PRIORITY CLAIM

The present application is a continuation of U.S. application Ser. No. 12/766,130, filed Apr. 23, 2010, which claims the priority of U.S. Provisional Application No. 61/171,998, filed Apr. 23, 2009, both of which are incorporated herein by reference in their entireties.

TECHNICAL FIELD

The present disclosure relates to backside illuminated image sensors, and a method of making the same.

BACKGROUND

An image sensor provides a grid of pixels, such as photosensitive diodes or photodiodes, reset transistors, source follower transistors, pinned layer photodiodes, and/or transfer transistors for recording an intensity or brightness of light. The pixel responds to the light by accumulating a charge. The charge can then be used by other circuits so that a color and brightness can be used for a suitable application, such as a digital camera. Common types of pixel grids include a charge-coupled device (CCD) or complimentary metal oxide semiconductor (CMOS) image sensor (CIS). Backside illuminated image sensors are used for sensing a volume of exposed light projected towards the backside surface of a substrate. The pixels are located on a front side of the substrate, and the substrate is thin enough so that light projected towards the backside of the substrate can reach the pixels. Backside illuminated image sensors provide a high fill factor and reduced destructive interference, as compared to frontside illuminated sensors.

As part of manufacturing the backside illuminated image sensors, the trench isolation structures serve to separate one pixel from a second pixel in the pixel region, and serve to separate one or more components in the peripheral circuit region. The conventional trench isolation structures in a silicon substrate have the same depth in the pixel region and the peripheral circuit region, which may not adequately isolate one pixel area from another. The depth of the conventional trench isolation structure may not be sufficient to keep a photo-generated carrier from a first pixel region to a second pixel region. This can cause leakage current to the sensor devices, and electrical crosstalk and defects such as dark current, white pixel and blooming to degrade the performance of the backside illuminated image sensors.

BRIEF DESCRIPTION OF THE DRAWINGS

The aforementioned objects, features and advantages of this disclosure will become apparent by referring to the following detailed description of the exemplary embodiments with reference to the accompanying drawings, wherein:

FIG. 1 to FIG. 5 are cross-sectional diagrams illustrating an exemplary embodiment of forming backside illuminated image sensors; and FIG. 6 to FIG. 8 are cross-sectional diagrams illustrating exemplary embodiments of forming an isolation structure in the pixel region of backside illuminated image sensor.

DETAILED DESCRIPTION OF ILLUSTRATIVE EMBODIMENTS

Figure 5:
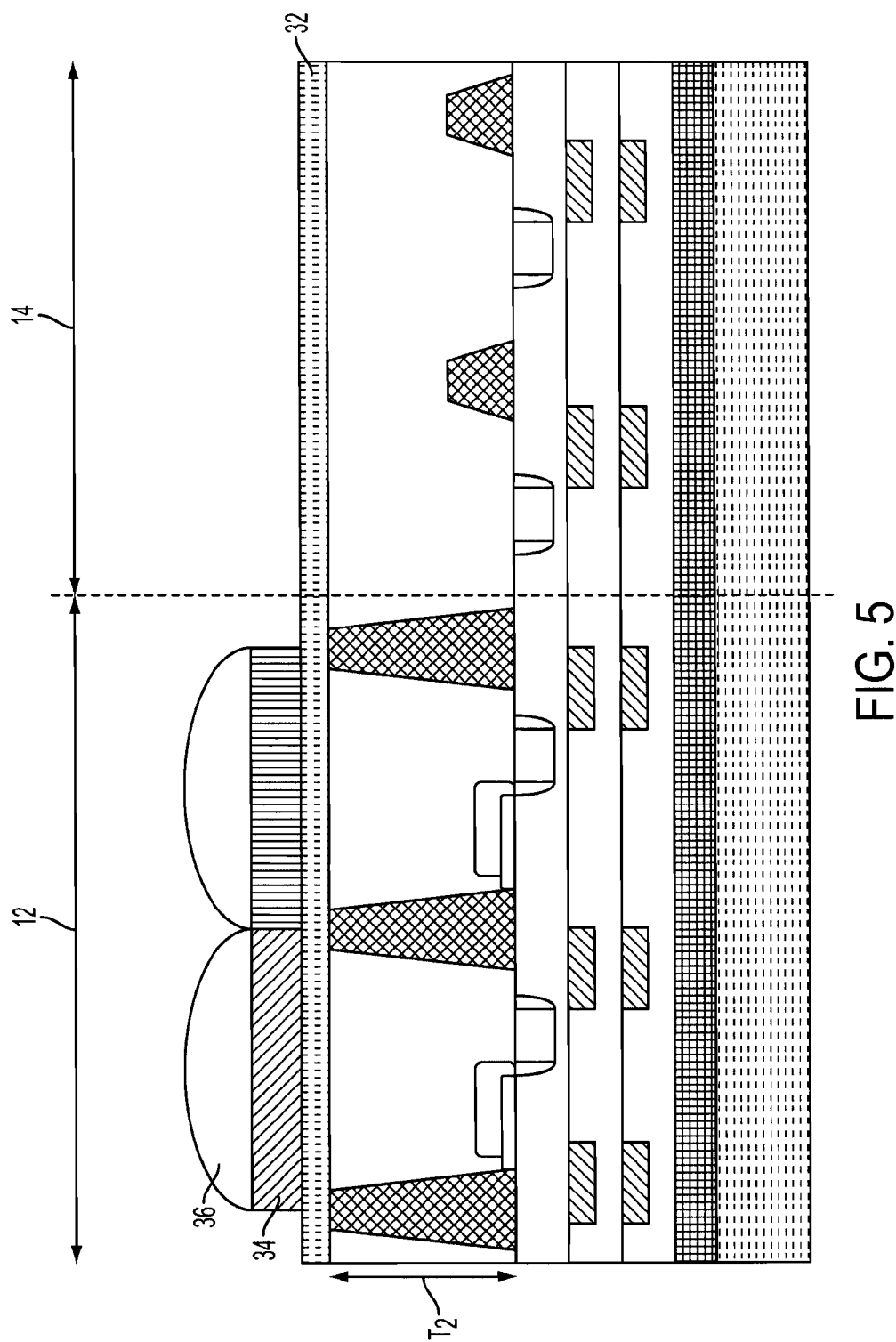

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Herein, cross-sectional diagrams of FIG. 1 to FIG. 5 illustrate an exemplary embodiment of a method of forming a backside illuminated image sensor.

Referring to FIG. 1, a substrate 10 having a front surface 10a and a back surface 10b is provided. The front surface 10a is an active surface on which circuit designs will be formed. The substrate 10 may be silicon in a crystalline structure. In an embodiment, the substrate 10 is a P-type substrate (e.g. a substrate doped with p-type dopants, such as boron or aluminum, by conventional processes such as diffusion or ion implantation). In other embodiments, the substrate 10 may include a $P^+$ substrate, $N^+$ substrate, and/or other conductivities known in the art. The substrate 10 may include a silicon-on-insulator (SOI) substrate. In alternative embodiments, the substrate 10 may include other elementary semiconductors such as germanium, or include a compound semiconductor such as, silicon carbide, gallium arsenide, indium arsenide, and indium phosphide. In an embodiment, the substrate 10 includes a sub layer and an epitaxial (epi) layer formed on the sub layer, in which the sub layer is a $P^+$ layer and the epi layer is a $P^-$ layer.

The substrate 10 is defined as a pixel region 12 and a peripheral region 14. The pixel region 12 is for forming an array of pixels. The peripheral region 14 is for forming additional circuitry and input/output, which provides an operation environment for the pixels and/or supports external communications with the pixels. The peripheral region 14 is also known as a logic region as it may include logic circuitry associated with the pixels.

A plurality of isolation structures 16a and 16b of different depths are formed in the substrate 10 of the pixel region 12 and the peripheral region 14, respectively. In the pixel region 12, the first isolation structure 16a includes a first trench 18a with a depth $D_1$ filled with a first insulating material layer 20a. The remaining portion of the substrate 10 between the bottom of the first isolation structure 16a and the back surface 10b of the substrate 10 has a thickness $T_1$, which will be removed in the subsequent thinning process. The first isolation structures 16a at least partially isolate one pixel from a second pixel in the pixel region 12. In an embodiment, the depth $D_1$ is between approximately 1.0 μm and 10 μm, and the thickness $T_1$ is between approximately 600 μm and 900 μm. In an embodiment, the depth $D_1$ is between approximately 1.8 μm and 2.2 μm, and the thickness $T_1$ is between approximately 700 Angstroms and 800 Angstroms. In the peripheral region 14, the second isolation structure 16b includes a second trench 18b with a depth $D_2$ filled with a second insulating material layer 20b for isolating one or more components formed in the peripheral region 14. The depth $D_2$ is less than the depth $D_1$. In an embodiment, the depth $D_2$ is less than approximately 1.0 μm. In an embodiment, the depth $D_2$ is between approximately 0.3 μm and 0.7 μm.

The trenches 16a and 16b may be formed by processes known in the art such as photolithography patterning followed by RIE to form trenches in the patterned areas. The insulating material layer 20a, 20b may be formed by depositing material using chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), sub-atmospheric CVD (SACVD), and/or other processes known in the art. In an embodiment, the insulating material layer 20a, 20b is silicon oxide. In an embodiment, the oxide is deposited by either HDPCVD or SACVD. The layer 20a, 20b may fill, partially or entirely, the trench 16a, 16b formed in the pixel region 12 and/or the peripheral region 14. After the deposition of the insulating material layer 20a, 20b, the layer is planarized by a chemical mechanical polish (CMP) process so that a substantially planar surface of the substrate 10 is provided.

Referring now to FIG. 2, illustrated is a step for fabricating image sensor elements 22, interconnection structures 26 and passivation layers 28 on the substrate 10.

Circuit design is formed on the front surface 10a of the substrate 10. The circuit design includes sensor elements, transistors, metal interconnects, metal contacts, metal pads, and other circuitry, and the metal interconnects are formed inside a dielectric layer and/or a passivation layer. It is understood that conventional processes and equipment are used to fabricate the sensor elements, transistors, metal interconnects, metal contacts, metal pads, and other circuitry. One or more sensor elements 22 are formed on the pixel region 12 of the substrate 10. In one embodiment, the sensor elements 22 may be disposed over the active surface and extended into the substrate 10. The sensor elements 22 each may comprise a light-sensing region (or photo-sensing region) which may be a doped region having n-type and/or p-type dopants formed in the substrate 10 by a method such as diffusion or ion implantation. The sensor elements 22 may include photodiodes, pinned layer photodiodes, non-pinned layer photodiodes, reset transistors, source follower transistors, transfer transistors, select transistors, complimentary metal-oxide-semiconductor (CMOS) image sensors, charged coupling device (CCD) sensors, active pixel sensors, passive pixel sensors, other sensors diffused or otherwise formed in the substrate 10, other active and/or passive features configured and coupled to provide proper functions such as imaging and/or sensing, and/or combinations thereof. As such, the sensor elements 22 may comprise conventional and/or future-developed image sensing devices. The sensor elements 22 may comprise a plurality of pixels disposed in a sensor array or other proper configuration. The plurality of sensor pixels may be designed having various sensor types. For example, one group of sensor pixels may be CMOS image sensors and another group of sensor pixels may be passive sensors. Moreover, the sensor elements 22 may comprise color image sensors and/or monochromatic image sensors. In the peripheral region 14, additional circuitry and input/outputs are provided adjacent to the sensor elements 22 for providing an operation environment for the sensor elements 22 and for supporting external communications with the sensor elements 22. For example, the sensor elements 22 may further comprise or be coupled to components such as an electric circuit so that the sensor elements 22 are operable to provide a proper response to illuminated light. In some embodiments, each of the sensor elements 22 may be configured to correspond with specific light wavelengths, such as a sensor element for sensing a red light wavelength, a sensor element for sensing a green light wavelength, and a sensor element for sensing a blue light wavelength.

Multi-layer interconnection structure 26 including the metal interconnects, metal contacts and other circuitry are provided inside a plurality of inter-layer dielectric layers 24 formed on the substrate 10. The interconnection structure 26 is coupled to the sensor elements 22 and other electric units formed in the substrate 10. The interconnection structure 26 includes various metal features, and contact features configured between metal layers and the substrate 10. The interconnection structure 26 further includes vias each configured between adjacent metal layers, coupling adjacent metal layers to one another. In the exemplary embodiment of this disclosure, the interconnection structure 26 includes copper. The interconnection structure 26 may alternatively or collectively include other conductive materials such as copper alloy, titanium, titanium nitride, tantalum, tantalum nitride, tungsten, polysilicon, metal silicide, or combinations thereof. The metal silicide may include nickel silicide, cobalt silicide, tungsten silicide, tantalum silicide, titanium silicide, platinum silicide, erbium silicide, palladium silicide, or combinations thereof. The interconnection structure 26 may include multiple-layer structures, such as a barrier layer, a copper seed layer, and bulk copper. In one example, the top metal layer includes aluminum and the rest of the metal layers include copper. The interconnection structure 26 may be formed by a technique such as chemical vapor deposition, physical vapor deposition (PVD or sputtering), plating, other suitable processes, or combinations thereof. For example, PVD may be used to form a copper seed layer, and then a plating process may be employed to deposit bulk copper for interconnection. The metal layers in FIG. 2 are only for example and simplicity. In various embodiments, the interconnection structure 26 may include less or more than three metal layers.

The inter-layer dielectric layer 24 is disposed on substrate 10 to isolate the interconnection structure 26. Various etch stop/barrier layers may be interposed between adjacent inter-layer dielectric layers 24 for providing an etch stop function utilized during damascene processes or a barrier function to eliminate moisture diffusion to the interconnection structure 26 and copper migration to the inter-layer dielectric layers 24. The stop/barrier layers may include silicon nitride, silicon oxynitride, or other suitable materials. The inter-layer dielectric layer 24 may include silicon dioxide such as undoped silica glass (USG), silicon nitride, silicon oxynitride, polyimide, spin-on glass (SOG), fluoride-doped silicate glass (FSG), carbon doped silicon oxide such as SiCOH, BLACK DIAMOND® (Applied Materials of Santa Clara, Calif.), XEROGEL™, AEROGEL™, amorphous fluorinated carbon, Parylene, BCB (bis-benzocyclobutenes), SILK™ (Dow Chemical, Midland, Mich.), and/or other suitable materials. The inter-layer dielectric layer 24 may be formed by any technique including spin-on, CVD, sputtering, or other suitable processes. For example, plasma enhanced (PE) CVD may be utilized to form silicon oxide from silane (SiH4) or tetraethoxysilane (TEOS). In another example, high density plasma (HDP) CVD may be utilized. The interconnection structure 26 and the inter-layer dielectric layer 24 may be formed in an integrated process referred to as a damascene process, such as a dual damascene process or a single damascene process.

A passivation layer 28 is provided on the inter-layer dielectric layer 24 to substantially cover the devices and seal the device from moisture and other contamination. The passivation layer 28 includes silicon oxide, silicon nitride, or the combinations thereof. Another passivation layers may be provided for enhanced passivation and adhesion. In the exemplary embodiment of this disclosure, the passivation layer 28 comprises a first silicon oxide layer, a second silicon nitride layer, and a third silicon oxide layer successively deposited on the inter-layer dielectric layer 24.

Referring now to FIG. 3, illustrated is a step for bonding a carrier substrate 30 to the passivation layer 28 and then flipping the bonded structure. The carrier substrate 30 may be coated by an adhesive layer, depending on the bonding method used. The carrier substrate 30 may provide protection for the various features formed on the substrate 10. The carrier substrate 30 may also provide mechanical strength and support for subsequent processes. The carrier substrate 30 may comprise any suitable material, such as silicon wafer and/or glass. In an embodiment, the carrier substrate 30 is $p^+$-type silicon substrate. Referring to FIG. 4, since the bonded structure is flipped, a thinning process e.g., grinding and/or etching is performed on the back surface 10b to remove the remaining portion of the substrate 10, which stops on the bottom of the first isolation structure 16a in the pixel region 12, re-exposing the bottom of the first isolation structures 16a in the pixel region 12. In an embodiment, the thinning process removes the remaining portion of thickness $T_1$ from the back surface 10b of the substrate 10, leaving a substrate thickness $T_2$ of the thinned substrate 10. In an embodiment, the substrate thickness is about 1~10 μm. This can make the device thin enough to allow the radiation incident on the back surface 10b of the substrate 10 to reach the sensor elements.

Then, referring to FIG. 5, processing of the back surface 10b of the substrate 10 is performed. An anti-reflective coating (ARC) layer 32 is formed on the back surface 10b of the substrate 10. The ARC layer 32 further reduces the reflection of incident light from the back surface 10b of the substrate 10. A color filter 34 is formed overlying the ARC layer 32 to filter light incident reaching the back surface 10b of the substrate 10. For example, the color filter layer 34 may include a plurality of color filters arranged in a matrix at positions corresponding to the sensor elements 22. In order to obtain images, the color filter layer 34 may transmit a light beam of a given color so that the light beam can reach the sensor elements 22. The color filter layer 34 may include red (R), green (G), and blue (B) color filters arranged in a Bayer pattern, for example. In addition, one or more micro lenses 36 are disposed above the color filter 34 and may correspond to the plurality of sensor elements 22. The micro lenses 36 may change the path of light incident on an area other than the sensor elements 22 such that the light may be focused onto the sensor elements 22.

A backside-illuminated image sensor according to an embodiment of this disclosure is illustrated in FIG. 5. The backside-illuminated image sensor includes a substrate 10 having a pixel region 12 and a peripheral region 14. A plurality of pixels is formed on the substrate 10 of the pixel region 12. The pixels include sensor elements 22 such as a photo detector and one or more transistors. The peripheral region 14 includes additional circuitry and input/outputs. A plurality of first isolation structures 16a of a depth $D_1$ is formed in the substrate 10 of the pixel region 12 and a plurality of second isolation structures 16b of a depth $D_2$ is formed in the substrate 10 of the peripheral region 14. Image sensor elements 22 are formed on the front surface 10a in the pixel region 12, logic circuitry is formed on the front surface 10a in the peripheral region 14, and interconnection structures 26 are formed over the sensor elements 22 and the logic circuitry. The back surface 10b is thinned downed to expose the bottom of the first isolation structures 16a, leaving the thinned substrate 10 of a substrate thickness $T_2$. Backside processes including forming an ARC layer 32, a color filter 34 and micro lenses 36 are performed on the back surface 10b of the thinned substrate 10.

Compared with the conventional isolation structures of identical depth, this disclosure provides the first isolation structures 16a in the pixel region 12 with the depth $D_1$ that is greater than the depth $D_2$ of the second isolation structures 16b in the peripheral region 14, and substantially equal to the substrate thickness $T_2$ of the thinned substrate 10. The first isolation structure 16a passing through the thinned substrate 10 can provide good isolation performance to reduce leakage (e.g., substrate electrical path) in the pixel region 12, and provide good light efficiency to enhance Quantum Efficiency and prevent cross talk. Also, in the backside thinning process, the bottom of first isolation structure 16a can serve as a stop layer.

FIG. 6 to FIG. 8 illustrate incremental modifications of the first isolation structures 16a corresponding to the step of FIG. 1

In an exemplary embodiment of forming the first isolation structure 16a in the pixel region 12 of backside illuminated image sensor, an implant region 40 is formed through an ion implantation process 42 in the substrate 10 adjacent to each the first isolation structure 16a to provide isolation between sensor elements 22. In an embodiment as depicted in FIG. 6, the implant region 40 is formed adjacent the sidewalls of the upper portion $16a_1$ of the first isolation structure 16a. In an embodiment as depicted in FIG. 7, the implant region 40 is formed adjacent the sidewalls of the upper portion $16a_1$ and the lower portion $16a_2$ of the first isolation structure 16a. In an embodiment as depicted in FIG. 8, the implant region 40 is formed not only adjacent the sidewalls of the first isolation structure 16a, but also underlying the bottom portion $16a_3$ of the first isolation structure 16a. The implant region 40 is a p-type region formed by doping the substrate 10 with p-type dopants such as, boron, $BF_2$, or other suitable material known in the art. The doping may be accomplished by conventional processes known in the art such as ion implantation or diffusion in a region defined by conventional photolithography processes. As a result, the implant region 40 provides electrical grounding and reduces leakage current of the sensor elements 22 and at the same time improves photo sensitivity, especially for blue light. Accordingly, quantum efficiency (percentage of incident light that is detected) of the backside illuminated image sensor is improved.

One aspect of this description relates to a backside illuminated image sensor. The backside illuminated image sensor includes a substrate, where the substrate includes a pixel region and a peripheral region. The substrate further includes a front surface and a back surface. The backside illuminated image sensor further includes a first isolation structure formed in the pixel region of the substrate, where a bottom of the first isolation structure is exposed at the back surface of the substrate. Additionally, the backside illuminated image sensor includes a second isolation structure formed in the peripheral region of the substrate, where the second isolation structure has a depth less than a depth of the first isolation structure. Furthermore, the backside illuminated image sensor includes an implant region adjacent to at least a portion of sidewalls of each isolation structure in the pixel region, where the portion of the sidewalls are located closer to the back surface than a top surface of the substrate, and where the second isolation structure is free of the implant region.

Another aspect of this description relates to a backside illuminated image sensor. The backside illuminated image sensor includes a substrate having a first surface and a light receiving surface, where the first surface includes a sensor element. The backside illuminated image sensor further includes first isolation structure passing through the substrate, where the first isolation structure has a first depth and a bottom of the first isolation structure is exposed at the light receiving surface of the substrate. The backside illuminated image sensor further includes a sensor element in the first surface of the substrate. Additionally, the backside illuminated image sensor includes a color filter overlying the light receiving surface of the substrate. Furthermore, the backside illuminated image sensor includes a second isolation structure in the substrate, wherein the second isolation structure has a second depth less than the first depth. The backside illuminated image sensor additionally includes an implant region adjacent to at least a portion of sidewalls of each first isolation structure, wherein the portion of the sidewalls are located closer to the light receiving surface than the first surface of the substrate, wherein the second isolation structure is free of the implant region.

Still another aspect of this description related to a method of making a backside illuminated image sensor. The method of making a backside illuminated image sensor includes forming a first isolation structure in a pixel region of a substrate, where the substrate includes the pixel region and a peripheral region, and where the substrate includes a front surface and a back surface. The method of making a backside illuminated image sensor further includes forming a second isolation structure in the peripheral region of the substrate, where the second isolation structure has a depth less than a depth of the first isolation structure. Furthermore, the method of making a backside illuminated image sensor includes exposing a bottom of the first isolation structure at the back surface of the substrate. Additionally, the method of making a backside illuminated image sensor includes forming an implant region adjacent to at least a portion of sidewalls of at least one isolation structure in the pixel region, where the second isolation structure is free of any implant region.

Although the present disclosure describes preferred embodiments, it is not intended to be limited to the precise embodiments disclosed herein. Those skilled in this technology can still make various alterations and modifications without departing from the scope and spirit of this invention.

What is claimed is:

1. A backside illuminated image sensor, comprising:
   a substrate comprising a pixel region and a peripheral region, wherein the substrate includes a front surface and a back surface;
   a first isolation structure formed in the pixel region of the substrate, wherein a bottom of the first isolation structure is exposed at the back surface of the substrate;
   a second isolation structure formed in the peripheral region of the substrate, wherein the second isolation structure has a depth less than a depth of the first isolation structure; and
   an implant region adjacent to at least a portion of sidewalls of each isolation structure in the pixel region, wherein the portion of the sidewalls are located closer to the back surface than a top surface of the substrate, wherein the second isolation structure is free of the implant region.

2. The backside illuminated image sensor of claim 1, wherein the substrate comprises a p-type dopant.

3. The backside illuminated image sensor of claim 1 further comprising, an inter-layer dielectric layer disposed over the front surface of the substrate.

4. The backside illuminated image sensor of claim 1, wherein a distance from a first point on the first isolation structure closest to the front surface to a second point on the first isolation structure closest to the back surface ranges from 1 micrometer (μm) to 10 μm.

5. The backside illuminated image sensor of claim 1, wherein a distance from a first point on the second isolation structure closest to the front surface to a second point on the second isolation structure closest to the back surface is less than about 1 μm.

6. The backside illuminated image sensor of claim 1 further comprising, a sensor element formed in the front surface of the substrate.

7. The backside illuminated image sensor of claim 6, wherein the sensor element comprises at least one of a photodiode, a pinned layer photodiode, a non-pinned layer photodiode, a reset transistor, a source follower transistor, a transfer transistor, a select transistor, a complimentary metal-oxide-semiconductor image sensor, a charged coupling device sensor, an active pixel sensor, or a passive pixel sensor.

8. The backside illuminated image sensor of claim 6, wherein a passivation layer is over the sensor element.

9. The backside illuminated image sensor of claim 8, wherein the interconnection structure comprises at least one of copper alloy, titanium, titanium nitride, tantalum, tantalum nitride, tungsten, polysilicon, nickel silicide, cobalt silicide, tungsten silicide, tantalum silicide, titanium silicide, platinum silicide, erbium silicide, or palladium silicide.

10. A backside illuminated image sensor, comprising:
    a substrate having a first surface and a light receiving surface;
    a first isolation structure passing through the substrate, wherein the first isolation structure has a first depth and a bottom of the first isolation structure is exposed at the light receiving surface of the substrate;
    a sensor element in the first surface of the substrate;
    a color filter overlying the light receiving surface of the substrate;
    a second isolation structure in the substrate, wherein the second isolation structure has a second depth less than the first depth; and
    an implant region adjacent to at least a portion of sidewalls of each first isolation structure, wherein the portion of the sidewalls are located closer to the light receiving surface than the first surface of the substrate, wherein the second isolation structure is free of the implant region.

11. The backside illuminated image sensor of claim 10, wherein the substrate comprises an n-type dopant.

12. The backside illuminated image sensor of claim 10 further comprising, an inter-layer dielectric layer disposed over the first surface of the substrate.

13. The backside illuminated image sensor of claim 12, wherein the inter-layer dielectric layer comprises at least one of an undoped silica glass, a silicon nitride, a silicon oxynitride, a polyimide, a spin-on glass, a fluoride-doped silicate glass, or a carbon doped silicon oxide.

14. The backside illuminated image sensor of claim 10, wherein a distance from a first point on the first isolation structure closest to the first surface to a second point on the first isolation structure closest to the light receiving surface ranges from 1 micrometer (μm) to 10 μm.

15. The backside illuminated image sensor of claim 10, wherein a distance from a first point on the second isolation structure closest to the first surface to a second point on the second isolation structure closest to the light receiving surface is less than about 1 μm.

16. The backside illuminated image sensor of claim 10, wherein a passivation layer is over the sensor element.

17. A backside illuminated image sensor, comprising:
- a substrate having a first surface and a light receiving surface;
- a first isolation structure extending from the first surface to the light receiving surface;
- a second isolation structure in the substrate, wherein the second isolation structure has a depth from the first surface less than a depth of the first isolation structure from the first surface;
- an implant region adjacent to at least a portion of sidewalls of each first isolation structure, wherein the portion of the sidewalls is located closer to the light receiving surface than the first surface, wherein the second isolation structure is free of the implant region; and
- an inter-layer dielectric layer over the first surface of the substrate.

18. The backside illuminated image sensor of claim 17 further comprising, an anti-reflective coating on the back surface of the substrate.

19. The backside illuminated image sensor of claim 18 further comprising, a color filter over the anti-reflective coating.

20. The backside illuminated image sensor of claim 19 further comprising, a micro lens over the color filter.

* * * * *